(12) United States Patent
Itou

(10) Patent No.: US 6,512,185 B2
(45) Date of Patent: Jan. 28, 2003

(54) PRINTED-WIRING BOARD

(75) Inventor: Kazuhiro Itou, Aichi (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/805,218

(22) Filed: Mar. 14, 2001

(65) Prior Publication Data
US 2001/0025724 A1 Oct. 4, 2001

(30) Foreign Application Priority Data
Mar. 15, 2000 (JP) .................................. P2000-071563

(51) Int. Cl.⁷ ................................................ H05K 1/16
(52) U.S. Cl. ...................... 174/260; 174/262; 174/266; 361/760; 439/876
(58) Field of Search ................................ 174/262, 263, 174/264, 265, 260, 266; 361/791, 760; 439/876

(56) References Cited

U.S. PATENT DOCUMENTS

| | | | | |
|---|---|---|---|---|
| 4,088,828 A | * | 5/1978 | Yamamoto et al. | 174/263 |
| 4,435,740 A | * | 3/1984 | Huckabee et al. | 361/749 |
| 4,610,758 A | * | 9/1986 | Wilson | 216/18 |
| 5,140,110 A | * | 8/1992 | Nakagawa et al. | 174/250 |
| 5,266,748 A | * | 11/1993 | Kawakami et al. | 174/264 |
| 5,657,924 A | * | 8/1997 | Wandke et al. | 228/219 |
| 6,176,947 B1 | * | 1/2001 | Hwang et al. | 148/400 |

FOREIGN PATENT DOCUMENTS

| | | | |
|---|---|---|---|
| JP | 409277082 A | * | 10/1997 |
| JP | 410013032 A | * | 1/1998 |
| JP | 410328880 A | * | 12/1998 |

* cited by examiner

Primary Examiner—David L. Talbott
Assistant Examiner—Ishwar B Patel
(74) Attorney, Agent, or Firm—Rader, Fishman & Grauer PLLC; Ronald P. Kananen, Esq.

(57) ABSTRACT

The invention provides a printed-wiring board that is capable of preventing the lift-off phenomenon without changing the related process for fabricating related printed-wiring boards. A printed-wiring board of the present invention has the structure in which land portions are formed on both sides (front side and back side) of a board, a through hole is formed through the board, and an electrically conducting layer is formed on the inside peripheral surface of the through hole by means of plating to connect between the above-mentioned land portions of a wiring pattern, wherein the entire surface of the land part including the opening circumference of the through hole is covered with an insulating layer that covers the other part of the wiring pattern on the component side and on the other hand the land part is not covered with an insulating layer and remains exposed on the soldering side.

1 Claim, 4 Drawing Sheets

PRINTED-WIRING BOARD

BACKGROUND OF THE INVENTION

1. Field of the Invention

This invention relates to a printed-wiring board including a multi-layered board, and more particularly relates to a structure of a land part of a through hole that is suitable in soldering between conducting bodies of a wiring pattern formed on both sides (front side and back side) of a board with lead-free solder.

2. Description of the Related Art

At first, the structure of a related printed-wiring board will be described with reference to the drawings.

FIG. 5 is a plan view of a component side around one through hole part of a related printed-wiring board, FIG. 6 is a plan view of the soldering side of the printed-wiring board shown in FIG. 5, FIG. 7 is a cross sectional side view of the cross sectional side view along the line A—A of the printed-wiring board shown in FIG. 5, and FIG. 8 is a cross sectional view for describing undesirable phenomenon that arises when the printed-wiring board shown in FIG. 5 is used for soldering.

A both-side printed-wiring board having the structure in which an electrically conducting layer is formed on the through hole surface by means of plating to electrically connect between conducting bodies on both sides (front side and back side) has been used widely for various electronic apparatuses as the low cost both-sides printed-wiring board.

As an example of the related both-sides printed-wiring board of this type, only one through hole part is shown in FIG. 5 to FIG. 8. In these drawings, the character 1 denotes the printed-wiring board. On the printed-wiring board 1, a wiring pattern formed by forming land portions 3a, 3b on both sides (front side and back side) of a board 2 consisting of insulative material such as glass epoxy resin is formed, and an electrically conducting layer 5 is formed on the inside peripheral surface of a through hole 4 formed through the board 2 from one land portion 3a to the other land portion 3b by means of plating to connect between both land portions 3a and 3b. The part of the wiring pattern other than both land portions 3a and 3b is covered with a layer 6 of insulative material (referred to as "insulating layer" hereinafter) such as solder resist.

The insulating layer 6 provided on both sides (front side and back side) of the printed-wiring board 1 covers the other part of the wiring pattern so as not to cover both land portions 3a and 3b, and as a matter of course the inside diameter Db of the insulating layer 6 is larger than the diameter Da of the through hole 4.

When a lead part, which is one type of electronic parts, is soldered on the printed-wiring board 1 having the structure described hereinabove, a lead L is inserted from a component side 1A, the head end of the lead L exposed to an opposite soldering side 1B is soldered to the land part 3b by use of solder S so that a fillet Sb is formed, and solder that fills in and passes through the through hole 4 forms a fillet Sa and solders a base of the lead L to the land part 3a.

However, in the case that lead-free solder is used for soldering, when lead-free solder is solidified, the fillet Sa on the component side 1A is partially separated from the land part 3a as shown with the arrow C or the fillet Sa lifts the land part 3a as shown with arrow D, that is, so-called lift-off phenomenon occurs.

The lift-off phenomenon does not occur when lead-containing solder is used and is special to lead-free solder, and occurs regardless of soldering process, including soldering process by use of a jet soldering tank and soldering bell. The part where lift-off phenomenon occurs does not depend on the type of soldering process. The lift-off phenomenon is likely due to the heat shrinkage or solidification shrinkage of lead-free solder itself, and a method for controlling or preventing the lift-off phenomenon has not been established yet.

It is required to prevent the lift-off phenomenon perfectly because a signal line lead out from the land part 3a is disconnected or a signal line (not shown in the drawing) is separated problematically when the land part 3a on the component side 1A is lifted, also because the long term reliability of solder junction where the lift-off phenomenon occurs is poor.

SUMMARY OF THE INVENTION

The present invention has been accomplished in view of the above-mentioned problem, and it is the object of the present invention to provide a printed-wiring board that is capable of preventing the lift-off phenomenon without changing the related fabrication process for fabricating a related printed-wiring board.

According to the invention, the above-mentioned problem is solved by applying a printed-wiring board, including a wiring pattern and land portions which are formed on a component side having electric components thereon and a soldering side of the board respectively, in which both of the land portions are connected with each other through an electrically conducting layer formed on an inside peripheral surface of a through hole bored through the board, and the wiring pattern is covered with an insulating layer, and in which one of the land portions on said component side is covered with the insulating layer.

When an electronic parts is soldered with lead-free solder, a lead-free solder fillet that has filled in and passed through the through hole from the soldering side stops at the above-mentioned component side end of the through hole, and the land part on the soldering side can secure the same soldering surface as that of the related printed-wiring board.

Therefore, electronic parts are soldered by means of a related soldering process, the lift-off phenomenon is prevented perfectly, separation of the land part and disconnection of wiring on the component side will not occur, and the reliability of a printed-wiring board is improved significantly.

DESCRIPTION OF THE PREFERRED EMBODIMENTS

A printed-wiring board in accordance with the present invention will be described hereinafter in detail with reference to FIG. 1 to FIG. 4.

Figure 1:
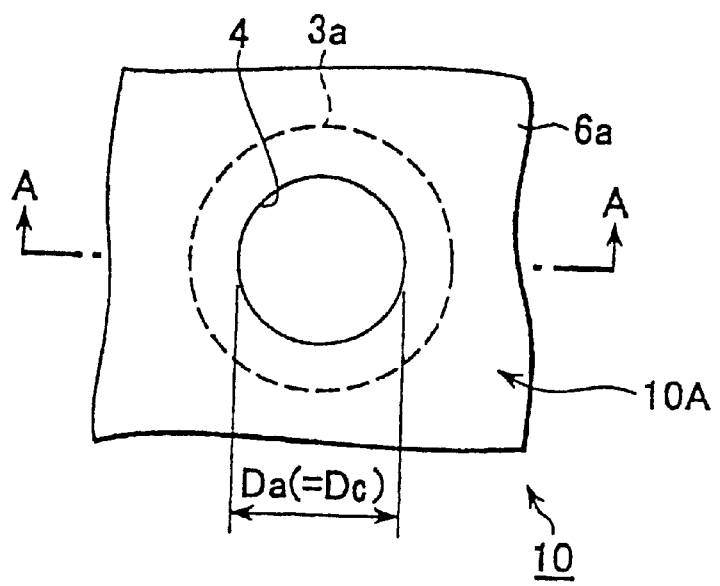
FIG. 1 is a plan view of the component side around one through hole of a printed-wiring board in accordance with one embodiment of the present invention.
Figure 2:
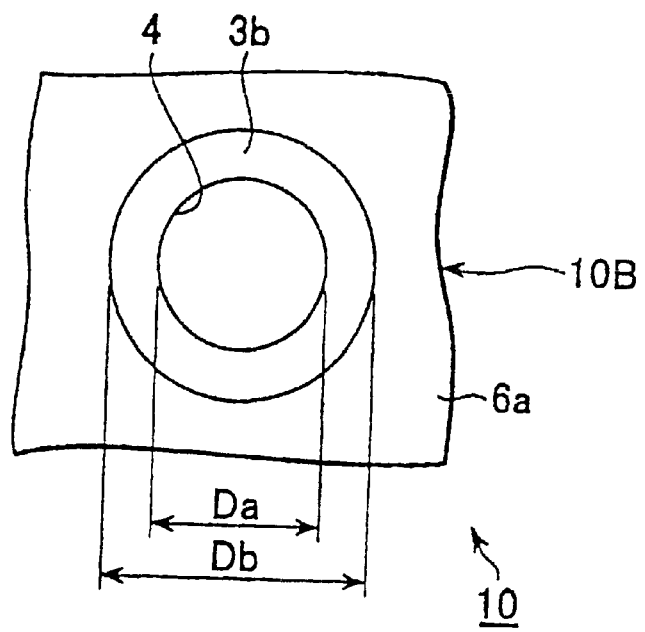
FIG. 2 is a plan view of the soldering side of the printed-wiring board shown in FIG. 1.
Figure 3:
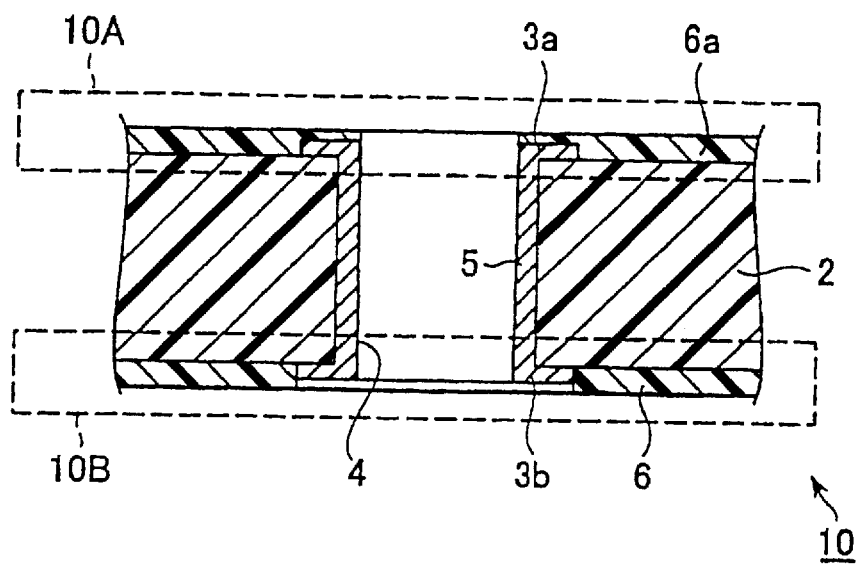
FIG. 3 is a cross sectional side view of the cross section view along the line A—A of the printed-wiring board shown in FIG. 1.
Figure 4:
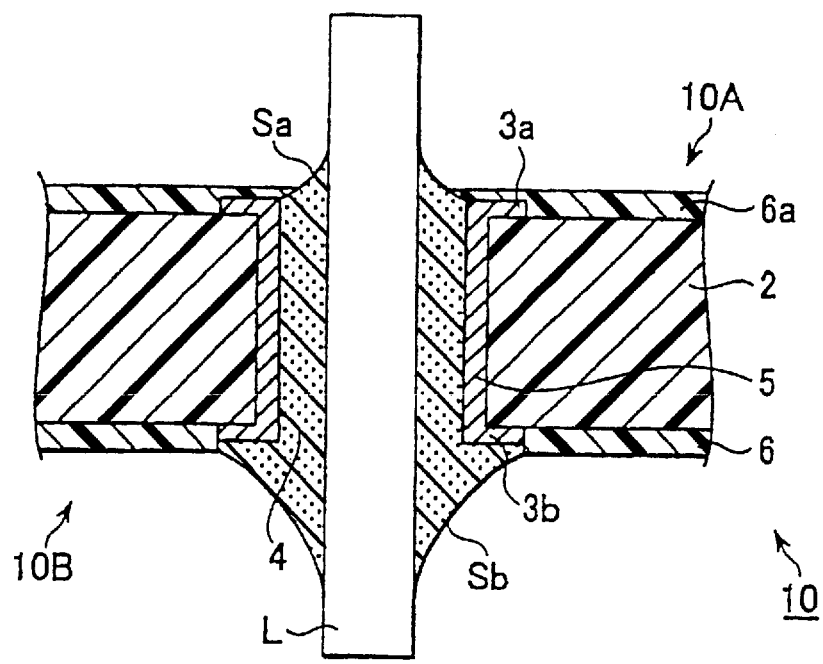
FIG. 4 is a cross sectional side view illustrating soldering state of solder soldered by use of the printed-wiring board shown in FIG. 1.
Figure 5:
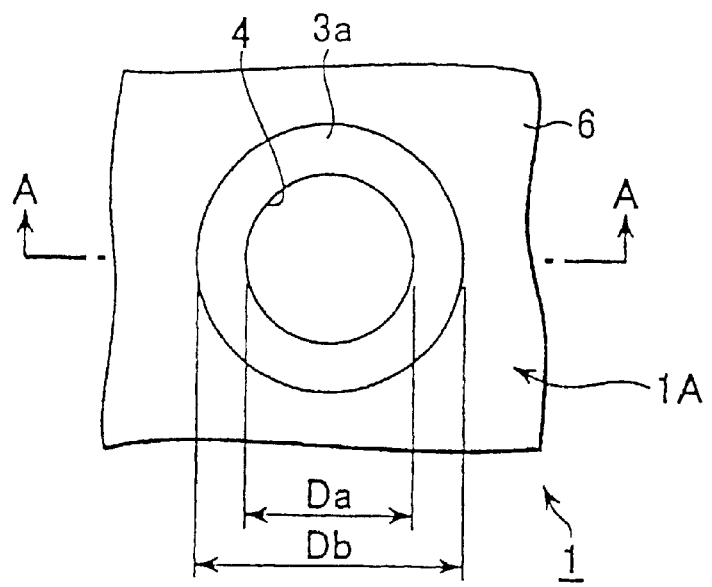
FIG. 5 is a plan view of the component side around one through hole of a printed-wiring board in accordance with the related art.
Figure 6:
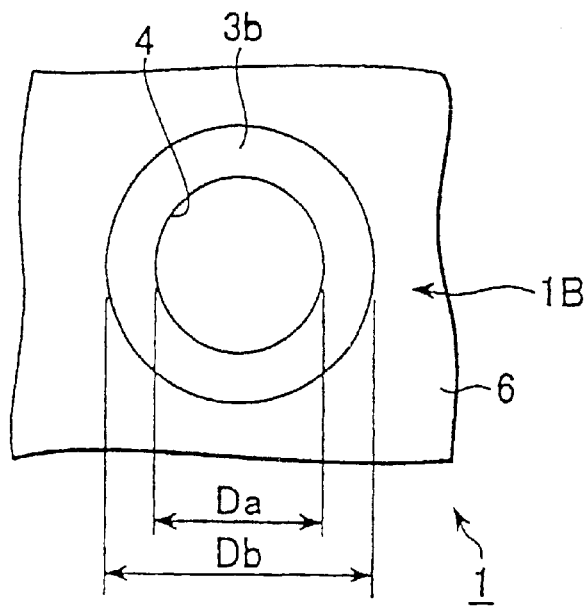
FIG. 6 is a plan view of the soldering side of the printed-wiring board shown in FIG. 5.
Figure 7:
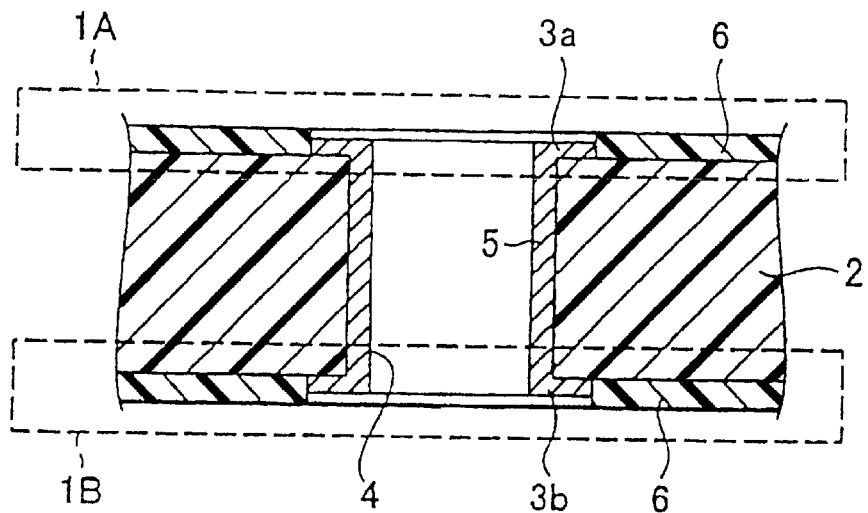
FIG. 7 is a cross sectional side view of the cross section view along the line A—A of the printed-wiring board shown in FIG. 5.
Figure 8:
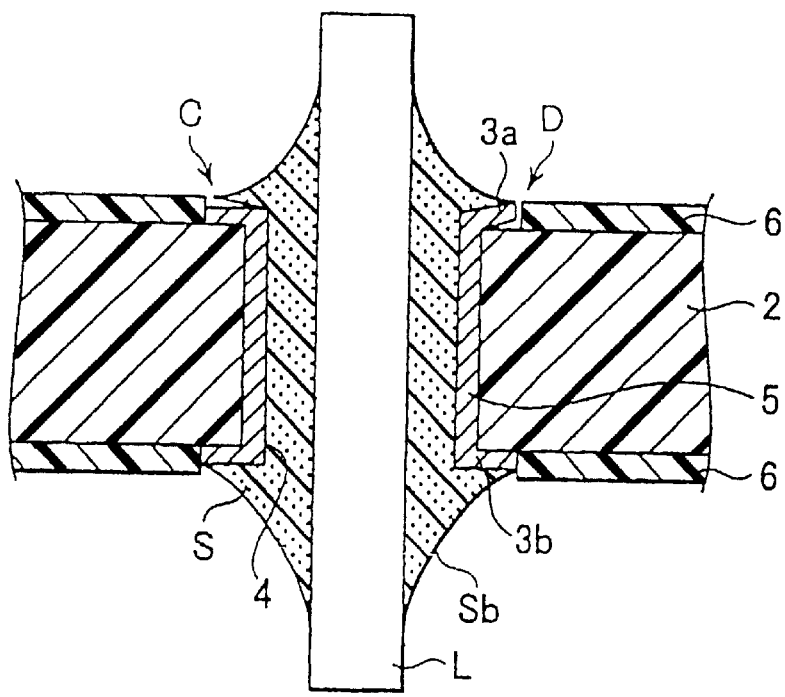
FIG. 8 is a cross sectional side view for illustrating undesirable phenomenon that occurs when the printed-wiring board shown in FIG. 5 is used for soldering.

FIG. 1 is a plan view of the component side around one through hole of the printed-wiring board in accordance with one embodiment of the present invention, FIG. 2 is a plan view of the soldering side of the printed-wiring board of the printed-wiring board shown in FIG. 1, FIG. 3 is a cross-sectional side view in the cross sectional side view along the line A—A of the printed-wiring board shown in FIG. 1, and FIG. 4 is a cross sectional side view illustrating the soldering state of solder soldered by use of the printed-wiring board shown in FIG. 1.

In the printed-wiring board of the present invention, the same components as used in the related printed-wiring board 1 are given the same characters for description.

In the drawings, the character 10 denotes the printed-wiring board in accordance with one embodiment of the present invention. The printed-wiring board 10 has the same structure as that of the related printed-wiring board 1. On the printed-wiring board 10, a wiring pattern formed by forming land portions 3a, 3b on both sides (front side and back side) of a board 2 consisting of insulative material such as glass epoxy resin is formed, and an electrically conducting layer 5 is formed on the inside peripheral surface of a through hole 4 formed through the board 2 from one land portion 3a to the other land portion 3b by means of plating to connect between both land portions 3a and 3b.

In the case of the printed-wiring board 10 of the present invention, the entire surface of the land portion 3a on the component side 10A side is covered including the opening circumference of the through hole 4 with an insulating layer 6a that covers other part of the wiring pattern. On the other hand, on the soldering side 10B, the insulating layer 6 covers the part of wiring pattern other than the land portion 3b as in the case of the related printed-wiring board 1, and the land portion 3b is not covered with the insulating layer 6 and remains exposed. In other words, the inside diameter Dc of the insulating layer 6a is equal to the diameter Da of the though hole 4 on the component side 10A of the printed-wiring board 10.

When an electronic parts is mounted and soldered on the printed-wring board 10, a lead L of the electronic parts is inserted from the component side 10A, and the head end of the lead L that is exposed to the soldering surface 10B is soldered on the land part 3b with lead-free solder S by means of a related soldering process.

On the soldering side 10B, lead-free solder S forms a fillet Sb to solder the head end of the lead L on the land part 3b, and other lead-free solder S fills in and passes through the through hole 4 and forms a fillet Sa on the component side 10A to solder the base of the lead L on the land part 3a. At that time, the fillet Sa stops at the upper end of the through hole 4 of the component side 10A and will not penetrate to and will not solder the land portion 3a of the component side 10A as shown in FIG. 4. The land portion 3b of the soldering side 10B secures the same soldering area as that of the related printed-wiring board, and the head end of the lead L can be soldered on the land portion 3b firmly.

In the above-mentioned embodiment, a single-layered board 2 consisting of insulative material is exemplified for description as the printed-wiring board 10, but a multi-layered board having wiring patterns formed between layers may be used instead of the board 2.

What is claimed is:

1. A printed-wiring board, including a wiring pattern and land portions which are formed on a component side having electric components thereon and a soldering side of the board respectively, both of said land portions being connected with each other through an electrically conducting layer formed on an inside peripheral surface of a hole bored through said board, said electric component being soldered with lead-free solder, and said wiring pattern being covered with an insulating layer, wherein a surface of one of said land portions on said component side is covered with said insulating layer, a surface of another one of said land portions on said soldering side is not covered with said insulating layer and, when a lead of one electrical component is soldered in the hole, the solder forms electrical contact along an entire length of electrically conducting layer and with the uncovered surface of the one land portion on said soldering side while the solder is prevented from forming electrical contact with the covered surface of the one land portion on said component side as a result of being covered with said insulating layer.

* * * * *